(12) United States Patent
Saenger et al.

(10) Patent No.: US 9,665,008 B2
(45) Date of Patent: May 30, 2017

(54) MIRROR SYSTEM COMPRISING AT LEAST ONE MIRROR FOR USE FOR GUIDING ILLUMINATION AND IMAGING LIGHT IN EUV PROJECTION LITHOGRAPHY

(71) Applicant: Carl Zeiss SMT GmbH, Oberkochen (DE)

(72) Inventors: Ingo Saenger, Heidenheim (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 478 days.

(21) Appl. No.: 14/255,569

(22) Filed: Apr. 17, 2014

(65) Prior Publication Data

US 2014/0226142 A1 Aug. 14, 2014

Related U.S. Application Data

(63) Continuation of application No. PCT/EP2012/072586, filed on Nov. 14, 2012.
(Continued)

(30) Foreign Application Priority Data

Nov. 15, 2011 (DE) .......... 10 2011 086 328

(51) Int. Cl.
*G03B 27/72* (2006.01)
*G03F 7/20* (2006.01)
(Continued)

(52) U.S. Cl.
CPC ....... *G03F 7/70191* (2013.01); *G02B 5/0891* (2013.01); *G02B 5/09* (2013.01);
(Continued)

(58) Field of Classification Search
CPC .......... G02B 5/0891; G02B 5/09; G02B 5/30; G02B 5/3024; G02B 5/3075;
(Continued)

(56) References Cited

U.S. PATENT DOCUMENTS 3,988,626 A * 10/1976 Boudouris ............... H01J 1/50
                                                                                     313/113
6,658,084 B2 12/2003 Singer
(Continued)

FOREIGN PATENT DOCUMENTS

DE       103 55 599 A1     7/2005
DE   10 2010 039 930     3/2012
(Continued)

OTHER PUBLICATIONS

German Office Action, with translation thereof, for corresponding DE Appl No. 10 2011 086 328.1, dated Jul. 13, 2012.
(Continued)

*Primary Examiner* — Christina Riddle
(74) *Attorney, Agent, or Firm* — Fish & Richardson P.C.

(57) ABSTRACT

A mirror serves for use for guiding illumination and imaging light in EUV projection lithography. The mirror has a reflective surface, the reflective surface forming a magnetic field in such a way that at least one polarization property of the illumination and imaging light is influenced via the magnetic field upon reflection. A mirror system has, besides the mirror, additionally a magnetization predefining device for predefining a magnetization of the reflective surface of the mirror. An illumination optical unit has at least one mirror of this type or at least one facet mirror device comprising at least one individual mirror constructed in this way. In the case of a mirror of this type, the illumination and/or imaging properties of illumination and/or imaging light guided via the mirror are improved.

13 Claims, 4 Drawing Sheets

Related U.S. Application Data

(60) Provisional application No. 61/559,771, filed on Nov. 15, 2011.

(51) Int. Cl.
*G02B 5/09* (2006.01)
*G02B 5/30* (2006.01)
*G02B 5/08* (2006.01)

(52) U.S. Cl.
CPC ........... *G02B 5/3075* (2013.01); *G03F 7/702* (2013.01); *G03F 7/70566* (2013.01); *G03F 7/70958* (2013.01)

(58) Field of Classification Search
CPC .. G03F 7/70191; G03F 7/70141; G03F 7/702; G03F 7/70566; G03F 7/70958; G03F 7/70308
USPC .. 355/30, 52, 53, 55, 57, 60, 66, 67–71, 77; 250/492.1, 492.2, 492.22, 492.23, 492.3, 250/493.1, 548, 503.1, 504 R; 359/483.01, 484.01, 484.04
See application file for complete search history.

(56) References Cited

U.S. PATENT DOCUMENTS

| | | | |
|---|---|---|---|
| 6,859,515 B2 | 2/2005 | Schultz et al. | |
| 7,196,841 B2 | 3/2007 | Melzer et al. | |
| 7,982,854 B2 | 7/2011 | Mann et al. | |
| 2006/0132046 A1 | 6/2006 | Schwarzl et al. | |
| 2008/0013680 A1 | 1/2008 | Singer et al. | |
| 2008/0198440 A1* | 8/2008 | Cho | B82Y 20/00 359/280 |
| 2013/0176545 A1 | 7/2013 | Ehm et al. | |

FOREIGN PATENT DOCUMENTS

| | | |
|---|---|---|
| EP | 1 225 481 | 7/2002 |
| WO | WO 2012/028569 | 3/2012 |

OTHER PUBLICATIONS

Qiu et al., "Surface magneto-optic Kerr effect," Review of Scientific Instruments, vol. 71, No. 3, 2000, pp. 1243-1255.
La-O-Vorakiat et al., "Magneto-Optical Kerr Effect probed using Ultrafast High-Order Harmonic EUV Light," 2009 USA/CLEO/IQEC.
International Search Report for corresponding PCT Appl No. PCT/EP2012/072586, dated Mar. 1, 2013.

\* cited by examiner

MIRROR SYSTEM COMPRISING AT LEAST ONE MIRROR FOR USE FOR GUIDING ILLUMINATION AND IMAGING LIGHT IN EUV PROJECTION LITHOGRAPHY

CROSS-REFERENCE TO RELATED APPLICATIONS

The present application is a continuation of, and claims benefit under 35 USC 120 to, international application PCT/EP2012/072586, filed Nov. 14, 2012, which claims benefit under 35 USC 119 of German Application No. 10 2011 086 328.1, filed Nov. 15, 2011. International application PCT/EP2012/072586 also claims priority under 35 USC 119(e) to U.S. Provisional Application No. 61/559,771, filed Nov. 15, 2011. International application PCT/EP2012/072586, DE 10 2011 086 328.1 and U.S. 61/559,771 are incorporated by reference.

The invention relates to a mirror system comprising at least one mirror for use for guiding illumination and imaging light in EUV projection lithography, an illumination optical unit comprising at least one mirror system of this type, an imaging optical unit comprising at least one mirror of this type or comprising at least one facet mirror device of this type, an illumination system comprising an illumination optical unit of this type and/or comprising an imaging optical unit of this type, a projection exposure apparatus comprising an illumination system of this type, a method for producing a micro- or nanostructured component using a projection exposure apparatus of this type, and a micro- or nanostructured component produced according to such a production method.

Illumination optical units comprising first facets displaceable between different illumination tilting positions, namely displaceable field facets, are known from U.S. Pat. No. 6,658,084 B2 and U.S. Pat. No. 7,196,841 B2. A further optical system is known from DE 103 55 599 A1.

It is an object of the invention to develop a mirror system of the type mentioned in the introduction in such a way that the illumination and/or imaging properties of illumination and/or imaging light guided via the mirror are improved.

This object is achieved according to the invention via a mirror system comprising at least one mirror having a reflective surface for use for guiding illumination and imaging light in EUV projection lithography. The reflective surface forms a magnetic field in so that at least one polarization property of the illumination and imaging light is influenced by the magnetic field upon reflection. The mirror system also comprises a magnetization predefining device for predefining a magnetization of the reflective surface of the mirror.

Via the mirror system according to the invention, it is possible to influence a polarization property and/or a polarization state of the illumination and/or imaging light reflected at the mirror. This results in the possibility of predefining desired polarization properties of the illumination and/or imaging light, as a result of which illumination and/or imaging properties of the light reflected via the mirror can be optimized. When influencing the polarization property it is possible, for example, to rotate the polarization direction of linearly polarized illumination and imaging light. Alternatively or additionally it is possible to convert linearly polarized into elliptically or circularly polarized illumination and/or imaging light.

When predefining the polarization property via mirror reflection, lower losses occur than in the case of EUV polarizers which are operated in transmission and which are known from U.S. Pat. No. 7,982,854 B2, for example. The polarization property of the illumination and/or imaging light can be influenced via the mirror's reflective surface forming the magnetic field, in particular by the magneto-optical Kerr effect, by the surface-magneto-optical Kerr effect, by the diffractive magneto-optical Kerr effect, by the non-linear magneto-optical Kerr effect or by the magneto-electric effect. In this case, it is possible to use materials and mirror and/or magnetic field geometries which are known from the literature concerning the magneto-optical Kerr effect. Examples thereof are found in the literature inter alia in Qiu et al., Review of Scientific Instruments, Vol. 71, No. 3, 2000, pages 1243 to 1255 and in La-O-Vorakiat et al., Magneto-Optical Kerr Effect probed using Ultrafast High-Order Harmonic EUV Light, 2009 USA/CLEO/IQEC, Document CPDA5.pdf.

The reflective surface forming the magnetic field can simultaneously be a highly reflective (HR) layer of the mirror for the respective used wavelength. The used wavelength is in the range of EUV wavelengths, in particular in the range of 5 nm and 30 nm.

Using the magnetization predefining device it is possible to predefine a desired magnetization of the reflective surface of the mirror. The magnetization can be switched on or off, for example. Alternatively, the magnetization can be predefined, and in particular regulated, continuously variably between a minimum magnetization, for example a vanishing magnetization and a maximum magnetization.

Materials for the reflective surface forming the magnetic field, such as a layer composed of a ferromagnetic material, a paramagnetic material and/or a magneto-electric material, represent material classes which are suitable, in principle, for influencing the polarization property of the illumination and imaging light. The material of the reflective surface that forms a magnetic field can be doped with magnetic ions, for example with Fe, Ni or Mn ions. An Fe—Ni layer can be involved. The layer can simultaneously constitute an HR (high reflective) layer of the reflective surface. The layer can have a layer thickness in the range of between 10 nm and 1 µm, in particular in the range of between 10 nm and 100 nm, for example in the range of 30 nm.

In the case of a facet mirror device comprising at least one individual mirror embodied as an individual mirror system, the individual mirrors can influence the illumination and imaging light impinging on them in each case in the same way with regard to its polarization property. Individual influencing of the polarization property of the respective rays which impinge on the individual mirrors of the facet mirror device is also possible.

In the case of a mirror system in which at least some of the individual mirrors are embodied as individual mirror systems, a facet mirror device comprising individually drivable and/or switchable mirror systems arises. The different individual rays which are guided via the individual mirrors of the facet mirror device can then be influenced individually with regard to their polarization properties. Jointly drivable and/or switchable mirror systems can also be used.

Magnetic field generators including at least one field coil and electric field generators are suitable as parts of the magnetization predefining device. Magnetic field strengths in the range of between 1 mT and 100 mT, for example in the range of 10 mT have proved to be suitable for predefining a desired polarization property. Even higher magnetic field strengths can be used for predefining the magnetization. If magneto-electric materials are used, it is possible to bring about a predefinition of the magnetization via an electric field generator that generates electric field strengths of up to a few kV/cm. Corresponding field strengths can be used, in particular, in connection with manganites as magneto-electric materials.

A switchable magnetization predefining device can be switchable between a first predefining state for predefining a first magnetization state of the reflective surface, and a second predefining state for predefining a second magnetization state of the reflective surface, which differs from the first magnetization state. This makes it possible to switch between different polarization properties of the illumination and imaging light. This can be used for demanding illumination and/or imaging tasks.

Individually drivable magnetization predefining devices in which at least some of the individual mirrors are embodied such that they are individually magnetizable via a respective magnetization predefining device can comprise, for example, capacitors or field coils individually assigned to the individual mirrors. These can be arranged, in particular, between the individual mirrors.

An illumination optical unit for illuminating an illumination field comprising at least one mirror system makes it possible to illuminate the illumination field with polarization properties of the illumination light that are coordinated with the respective illumination angle.

An imaging optical unit for imaging an object field into an image field comprising at least one mirror system makes it possible to image an object arranged in the object field with imaging light having polarization properties assigned to the respective imaging beam path.

The advantages of an illumination system comprising such an illumination optical unit or an imaging optical unit, of a projection exposure apparatus including such an illumination optical unit and/or such an imaging optical unit, of a production method which comprises using such a projection exposure apparatus and of a micro- or nanostructured device or component made by such a process correspond to those which have already been explained above with reference to the mirror according to the invention, the facet mirror device according to the invention and the mirror system according to the invention.

Exemplary embodiments of the invention are explained in greater detail below with reference to the drawing, in which:

FIG. 1 shows a projection exposure apparatus for microlithography schematically and with respect to an illumination optical unit in meridional section;

FIG. 2 shows a mirror of the illumination optical unit according to FIG. 1 or of a projection optical unit of the projection exposure apparatus according to FIG. 1 having a reflective surface forming a magnetic field in such a way that at least one polarization property of illumination and imaging light is influenced via the magnetic field upon reflecting at the mirror, wherein the magnetic field is oriented in such a way that a polar magneto-optical Kerr effect results;

Figure 6:
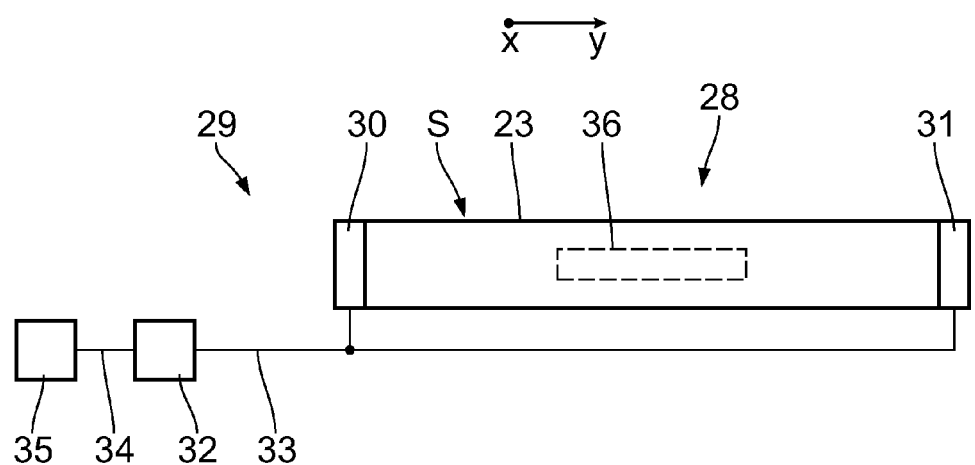
FIG. 6 shows, in an illustration similar to FIGS. 2 to 4, the mirror with a magnetization predefining device comprising an electric field generator in the form of a capacitor.
Figure 7:
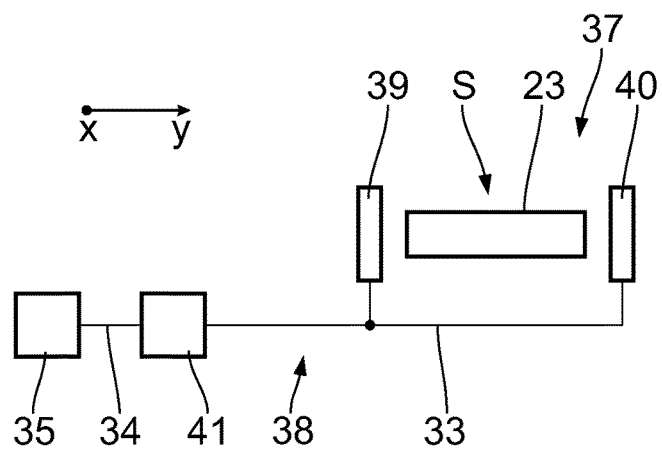
FIG. 7 shows, in an illustration similar to FIGS. 2 to 4, the mirror with a variant of a magnetization predefining device comprising a magnetic field generator, comprising two field coils.
Figure 8:
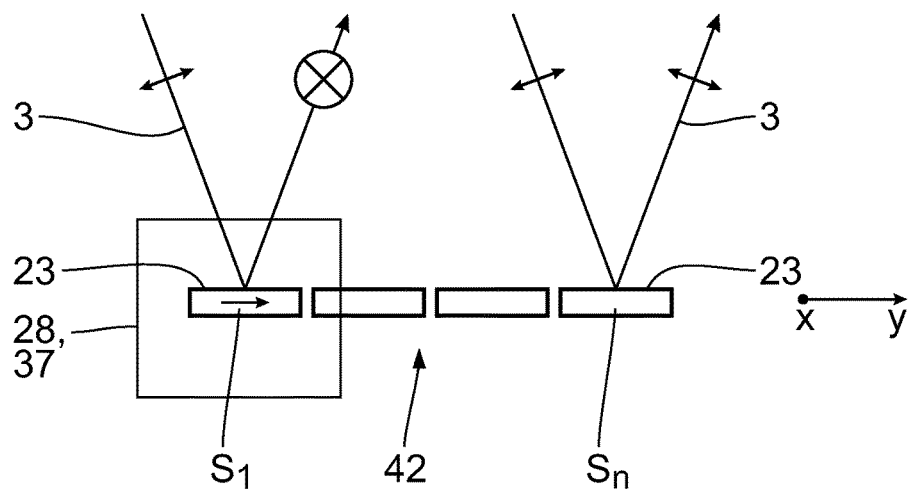
Figure 9:
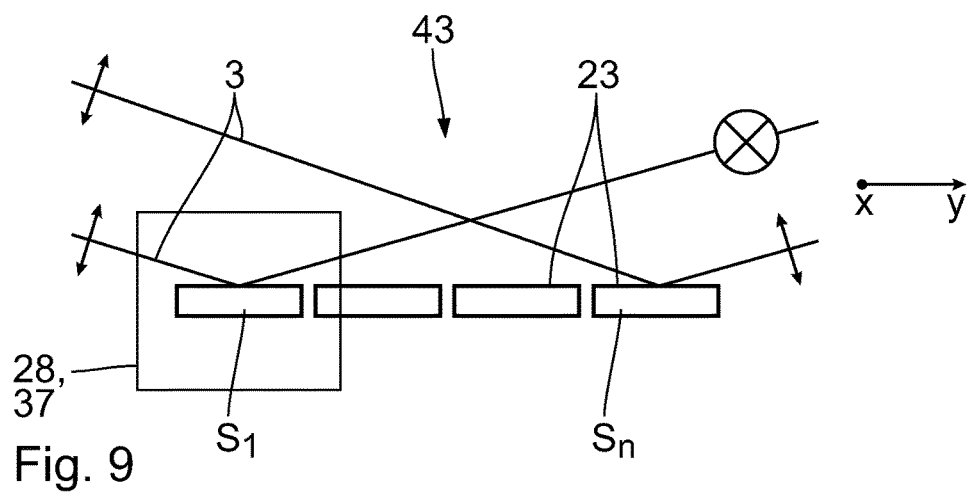

FIG. 8 shows some individual mirrors of a facet mirror device as part of the illumination optical unit, wherein the individual mirrors are constructed as mirror systems each comprising a magnetization predefining device according to FIG. 6 or 7 and are optimized for reflection with a small angle of incidence; and FIG. 9 shows some individual mirrors of a facet mirror device as part of the illumination optical unit, wherein the individual mirrors are constructed as mirror systems each comprising a magnetization predefining device according to FIG. 6 or 7 and are optimized for reflection with a large angle of incidence.

A projection exposure apparatus 1 for microlithography serves for producing a micro- or nanostructured electronic semiconductor component. A light source 2 emits EUV radiation used for illumination in the wavelength range of, for example, between 5 nm and 30 nm. The light source 2 can be a GDPP (gas discharge produced plasma) source or an LPP (laser produced plasma) source. A radiation source based on a synchrotron can also be used for the light source 2. Information concerning such a light source can be found by the person skilled in the art in U.S. Pat. No. 6,859,515 B2, for example. EUV illumination and imaging light or illumination and imaging radiation 3 is used for illumination and imaging within the projection exposure apparatus 1. The EUV illumination light 3, downstream of the light source 2, firstly passes through a collector 4, which can be, for example, a nested collector having a multi-shell construction known from the prior art, or alternatively an ellipsoidally shaped collector. A corresponding collector is known from EP 1 225 481 A. Downstream of the collector 4, the EUV illumination light 3 firstly passes through an intermediate focal plane 5, which can be used for separating the EUV illumination light 3 from undesirable radiation or particle portions. After passing through the intermediate focal plane 5, the EUV illumination light 3 firstly impinges on a field facet mirror 6.

Figure 1:
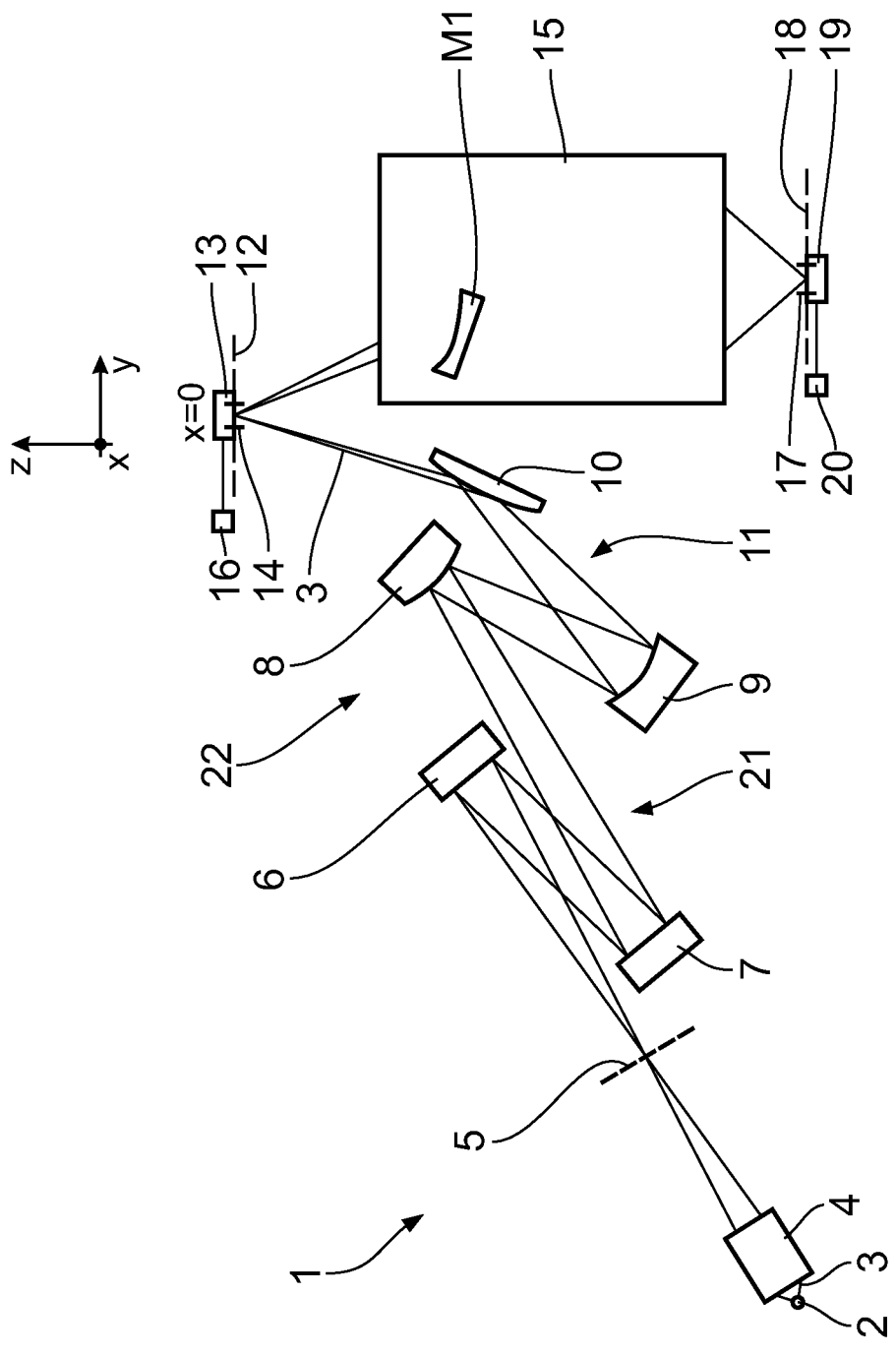

In order to facilitate the description of positional relationships, a Cartesian global xyz coordinate system is in each case depicted in the drawing. In FIG. 1, the x-axis runs perpendicularly to the plane of the drawing and out of the latter. The y-axis runs toward the right in FIG. 1. The z-axis runs upward in FIG. 1.

In order to facilitate the description of positional relationships for individual optical components of the projection exposure apparatus 1, a Cartesian local xyz or xy coordinate system is in each case also used in the following figures. The respective local xy coordinates span, unless described otherwise, a reflection plane of the optical component. The x-axes of the global xyz-coordinate system and of the local xyz- or xy-coordinate systems run in parallel to one another. The respective y-axes of the local xyz- or xy-coordinate systems are at an angle with respect to the y-axis of the global xyz-coordinate system, which corresponds to a tilting angle of the respective optical component about the x-axis.

After reflection at the field facet mirror 6, the EUV illumination light 3 split into beams or partial beams assigned to individual field facets of the field facet mirror impinges on a pupil facet mirror 7.

The field facets of the field facet mirror 6 are assigned to pupil facets of the pupil facet mirror 7 via a respective object field illumination channel. The channel-wise assignment of the pupil facets to the field facets is effected in a manner dependent on a desired illumination by the projection exposure apparatus 1. Corresponding facet mirror embodiments and facet mirror arrangements are known to the person skilled in the art for example from U.S. Pat. No. 6,658,084 B2 and U.S. Pat. No. 7,196,841 B2. Via the pupil facet mirror 7 (cf. FIG. 1) and a downstream transverse optical unit 11, consisting of three EUV mirrors 8, 9, 10, the field facets are imaged into an object plane 12 of the projection exposure apparatus 1. The EUV mirror 10 is embodied as a mirror for grazing incident (grazing incidence mirror). Arranged in the object plane 12 is a reticle 13, from which, with the EUV illumination light 3, an illumination region is illuminated in the form of an illumination field which coincides with an object field 14 of a downstream projection optical unit 15 of the projection exposure apparatus 1. A mirror M1 of the catoptric projection optical unit 15 is illustrated schematically in FIG. 1. The object plane 12 is therefore the object plane of the projection optical unit 15. The object field illumination channels are superimposed in the object field 14. The EUV illumination light 3 is reflected from the reticle 13. The reticle 13 is carried by a reticle holder 16.

The projection optical unit 15 images the object field 14 in the object plane 12 into an image field 17 in an image plane 18. Arranged in the image plane 18 is a wafer 19, which bears a light-sensitive layer, which is exposed during the projection exposure via the projection exposure apparatus 1. The wafer 19 is carried by a wafer holder 20. During the projection exposure, both the reticle holder 16 and the wafer holder 20 are scanned in a synchronized manner in the y-direction. The projection exposure apparatus 1 is embodied as a scanner. The scanning direction y is an object displacement direction.

The field facet mirror 6, the pupil facet mirror 7 and the mirrors 8 to 10 of the transfer optical unit 11 are parts of an illumination optical unit 21 of the projection exposure apparatus 1. The illumination optical unit 21 illuminates an illumination field that coincides with the object field 14. Together with the projection optical unit 15, the illumination optical unit 21 forms an illumination system 22 of the projection exposure apparatus 1.

Figure 2:
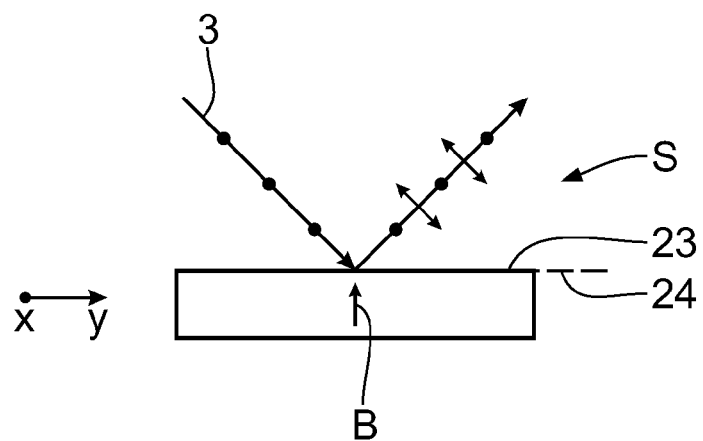

FIG. 2 shows, in a schematic side view, a mirror S of the illumination system 22 for use for guiding the illumination and imaging light 3. The mirror S can be one of the mirrors of the illumination optical unit 21, for example one of the facet mirrors or individual mirrors of the field facet mirror 6 or of the pupil facet mirror 7, one of the EUV mirrors 8 to 10 or else one of the mirrors of the projection optical unit 15, for example the mirror M1. More than one mirror of the illumination system 22 can also be embodied in the manner of the mirror S.

The mirror S has a reflective surface 23 magnetized by a magnetic field B in such a way that at least one polarization property of the illumination and imaging light 3 is influenced via the magnetic field B upon reflection at the reflective surface 23. In the case of the embodiment according to FIG. 2, the magnetic field B is oriented in polar fashion. Typical field strengths of the magnetic field B are in the range of between 1 mT and 100 mT, for example 10 mT. The magnetization of the reflective surface 23 is therefore oriented perpendicularly to the reflective surface 23. In the case of this polar orientation of the magnetization, a polar magneto-optical Kerr effect (PMOKE) occurs upon reflection of the illumination and imaging light 3 at the reflective surface 23. This is illustrated by way of example in FIG. 2 on the basis of the example of a ray of the illumination and imaging light 3 that is incident in s-polarized fashion. The s-polar-ization of the illumination light 3 is indicated by dots on the ray, as is customary in optics. On account of the PMOKE the polarization direction of the incident illumination light 3 is rotated upon reflection at the reflective surface 23. In the case of the exemplary embodiment according to FIG. 2, this effect results in a 90° rotation of the incident s-polarization, such that the illumination light 3 is present in p-polarized fashion after reflection at the reflective surface 23, which is indicated in FIG. 2 by double-headed arrows perpendicular to the ray direction, as is usual in optics. The emergent illumination light 3 also has in addition to the p-polarization component, an s-polarization component having a lower intensity in comparison with the p-polarization component, which is indicated by dots on the emergent ray of the illumination light 3 in FIG. 2. This therefore results in an emergent ray of the illumination light 3 having elliptical polarization, wherein the longer major axis of this ellipse runs in the direction of the p-polarization.

Angles of rotation of the polarization other than 90° upon reflection at the reflective surface 23, as in the example in FIG. 2, are also possible, in particular much smaller angles of rotation. In particular, angles of rotation of the polarization direction of the illumination light 3 in the range of between 7° and 90° can occur in the case of the PMOKE.

Therefore, the polarization state of the illumination light 3 can be influenced in a predefined manner by reflection at the reflective surface 23.

Figure 3:
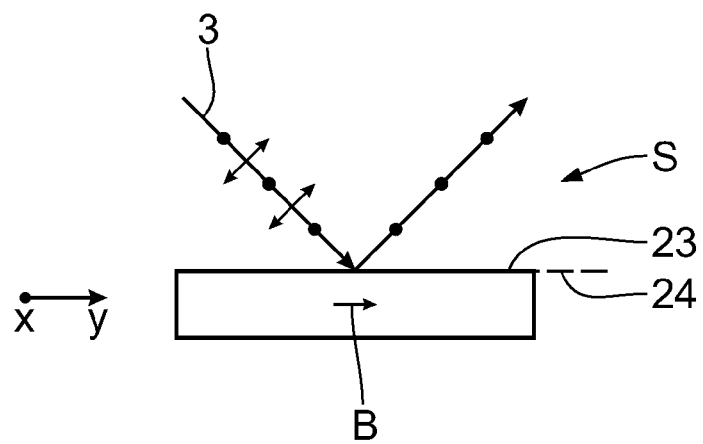
FIG. 3 shows, in an illustration similar to FIG. 2, the mirror having an orientation of the magnetic field in such a way that a longitudinal magneto-optical Kerr effect results.

FIG. 3 shows a further embodiment of the mirror S, in which the magnetic field B of the reflective surface 23 is oriented longitudinally, that is to say parallel to a reflection plane 24 of the mirror S and parallel to the plane of incidence of the illumination light 3. The reflection plane 24 is in turn parallel to the xy plane.

The longitudinal magneto-optical Kerr effect (LMOKE) occurs upon reflection of the illumination light 3 at the reflective surface 23 with longitudinally oriented magnetization according to FIG. 3. The effect brings about a rotation of the polarization direction. In the example illustrated, an incident p-polarization of the illumination light 3 is rotated into an s-polarization of the emergent illumination light 3 as a result of the LMOKE. Angles of rotation of the polarization of between 7° and 90° are possible in the case of the LMOKE as well.

Figure 4:
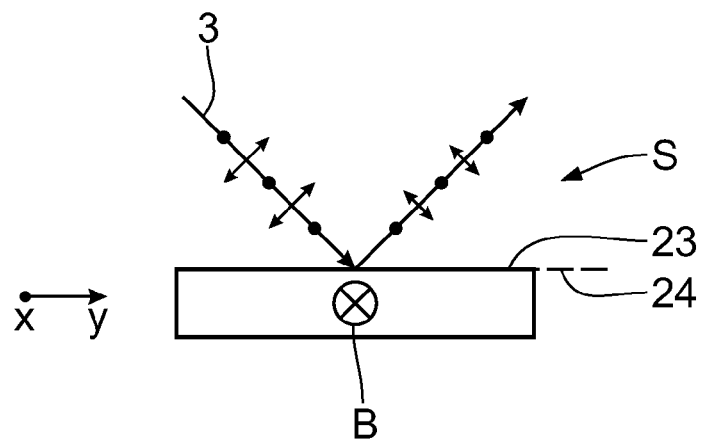
FIG. 4 shows, in an illustration similar to FIG. 2, the mirror having an orientation of the magnetic field in such a way that a transverse magneto-optical Kerr effect results.

In the case of the embodiment according to FIG. 4, the magnetization of the reflective surface 23 of the mirror S is present in transverse fashion, that is to say perpendicularly to the plane of incidence of the illumination light 3 and simultaneously parallel to the reflective surface 23. In the case of the thus transversely oriented magnetization of the reflective surface 23 the transverse magneto-optical Kerr effect (TMOKE) occurs upon reflection of the illumination light 3 at the reflective surface 23. The effect brings about a polarization-dependent change in the intensity of the reflective ray. This is in FIG. 4 on the basis of the example of an incident ray of the illumination light 3 having both a p-polarization component and an s-polarization component. The p-polarization component is additionally attenuated by the TMOKE in contrast to the s-polarization component, such that the emergent ray of the illumination light 3 after the reflection at the reflective surface 23 is elliptically polarized with a smaller p-polarization component and a larger s-polarization component on account of the TMOKE.

Figure 5:
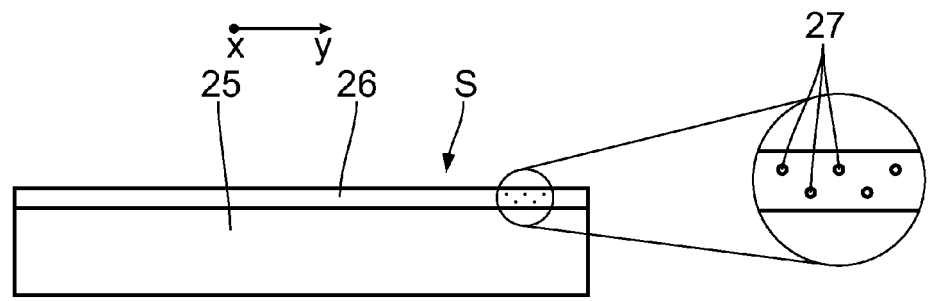
FIG. 5 shows, in an illustration similar to FIG. 2, a variant of a layer construction of the mirror comprising a reflective layer that builds up the magnetic field.

Overall, the mirror S can be formed from a material forming a magnetic field, as indicated schematically in FIGS. 2 to 4. Alternatively, it is possible to provide a layer 26 forming a magnetic field on a carrier material 25 of the mirror S, as illustrated schematically in FIG. 5. The layer 26 can be composed of one of the following materials: ferromagnetic material, paramagnetic material or magneto-electric material. As illustrated in an enlarged detail in FIG. 5, the layer 26 can be doped with magnetic ions 27, for example with Fe ions, Ni ions or Mn ions. The layer 26 can have a layer thickness in the range of between 10 nm and 100 nm, in particular in the range of 30 nm. The layer 26 can be an Fe/Ni layer.

The layer 26 can simultaneously constitute a highly reflective layer (HR layer) for the illumination and imaging light 3 and can comprise a multilayer structure comprising alternating molybdenum/silicon layers.

FIG. 6 shows a mirror system 28, which can be used in the illumination optical unit 21 or in the projection optical unit 15 in one of the mirrors therein. Besides the mirror S, which, in the embodiment according to FIG. 6, comprises at least one layer composed of a magneto-electric material, for example composed of a hexagonal manganite, the mirror system 28 has a magnetization predefining device 29 for predefining a magnetization of the reflective surface 23 of the mirror S. The magnetization predefining device 29 has an electric field generator, to which a capacitor comprising two capacitor plates 30, 31 and a voltage source 32 belong. The voltage source 32 is in electrical contact with capacitor plates 30, 31 via electrical lines 33. The capacitor plates 30, 31 are in contact directly with a lateral wall of the mirror S. The voltage source 32 is signal-connected to a magnetization control device 35 via a control line 34.

For predefining a desired magnetization of the reflective surface 23, the control device 35 controls the application of a predefined voltage to the capacitor plates 30, 31 via the voltage source 32. The voltage brings about a magnetization of the magneto-electric material of the reflective surface 23 of the mirror S. Depending on the geometry of incidence of the illumination light 3 it is thereby possible to bring about, in particular, a longitudinal or a transverse magnetization of the reflective surface 23.

In addition to the capacitor plate pair comprising the capacitor plates 30, 31 bearing against the lateral wall of the mirror S in a manner situated opposite one another and spaced apart from one another in the y-direction, a further pair 36 of capacitor plates can bear against the lateral wall of the mirror S in a manner spaced apart from one another in the x-direction, as indicated by dashed lines. One of the capacitor plates of the pair 36 is therefore visible in the view according to FIG. 6, and the other is concealed by the mirror S. The pair 36 can also be connected to the voltage source 32 and the magnetization control device 35, such that it is possible to switch between a longitudinal and transverse magnetization via the control device 35. The magnetization predefining device 29 is then switchable between a first predefining state for predefining a first magnetization state of the reflective surface 23, for example a longitudinal magnetization, and a second predefining state for predefining a second magnetization state of the reflective surface 23, that is to say for example a transverse magnetization. The control device 35 makes it possible to switch between different magnetization states with a time constant in the range of one second, fast switching in the range between 10 ms and 100 ms also being possible.

FIG. 7 shows a further variant of a mirror system 37 with a further embodiment of a magnetization predefining device 38. Components corresponding to those which have already been explained above with reference to FIGS. 1 to 6, and in particular with reference to FIG. 6, bear the same reference numerals and will not be discussed in detail again.

The magnetization predefining device 38 has two field coils 39, 40, arranged adjacent to the lateral wall of the mirror S, when the mirror S lies between the two field coils 39, 40. The two field coils 39, 40 are spaced apart from the lateral wall of the mirror S. The field coils 39, 40 are in electrical contact with a current source 41 via the electrical lines 33. The field coils 39, 40 are part of a magnetic field generator that also includes the current source 41. The current source 41 is connected to the magnetization control device 35 via the control line 34. In the case of the magnetization predefining device 38, too, besides the field coil pair comprising the field coils 39, 40 yet another field coil pair can be provided in order, analogously to what has been explained above in connection with the magnetization predefining device 29 according to FIG. 6, to influence the magnetization independently in the x-direction and in the y-direction.

FIG. 8 shows a facet mirror device 42, that can be used instead of the field facet mirror 6 or the pupil facet mirror 7. The facet mirror device 42 has mirrors S of the type of one of the variants explained above with reference to FIGS. 1 to 7. The facet mirror device 42 can comprise a plurality of the mirrors S according to FIGS. 2 to 5. Alternatively or additionally, the facet mirror device 42 can comprise a plurality of the mirror systems 28 and/or 37.

The effect of using mirror systems 28 and/or 37 of this type is illustrated schematically in FIG. 8 on the basis of the example of incident rays of illumination light 3 having p-polarization. A mirror $S_1$ of the mirror system 28 and/or 37 illustrated on the far left in FIG. 8 has a magnetization of the reflective surface 23 that is predefined longitudinally via the respective predefining device. This has the effect that the polarization of the incident illumination light 3 is rotated to an s-polarization after reflection at the reflective surface 23 of the mirror $S_1$. The mirror $S_n$ illustrated on the far right in FIG. 8 has no magnetization. This can be achieved by the mirror $S_n$ being embodied without a magnetizable reflective surface 23, or alternatively by the magnetization predefining devices 29 and/or 38 being set such that the reflective surface 23 has a magnetization M=0. In this case, the illumination light 3 incident in p-polarized fashion is also p-polarized after reflection at the reflective surface 23 of the mirror S. In this way, a predefined polarization state and/or a predefined polarization property of the associated ray of the illumination light 3 can be predefined for each object field illumination channel.

In the case of the facet mirror device 42 according to FIG. 8, the reflective surfaces 23 are fashioned such that their reflectivity is optimized for small angles of incidence, for example for angles of incidence in the range of normal incidence or for angles of incidence in the range of 45°.

FIG. 9 shows a further embodiment of a facet mirror device 43. Components corresponding to those which have already been explained above with reference to FIGS. 1 to 8 and in particular with reference to FIG. 8, bear the same reference numerals and are not discussed in detail again.

In contrast to FIG. 8, the individual mirrors $S_1$ to $S_n$ are equipped with reflective surfaces 23 optimized for grazing angles of incidence (grazing incidence). An approximated Faraday geometry is present in which the magnetic field in the case of the longitudinal magnetization is virtually parallel to the light propagation.

With the aid of the mirrors S having the reflective surface 23 forming a magnetic field or with the aid of the mirror systems 28, 37, when used in a facet mirror device 42 and/or 43, it is possible to produce an illumination geometry in which the object field is illuminated with different polarization properties and/or polarization states of the illumination and imaging light 3 depending on the illumination angle. By way of example, a tangential polarization of the illumination can be generated, or else a radial polarization. Other polarization geometries of the illumination can also be predefined.

The projection exposure involves providing the reticle 13 and the wafer 19, which bears a light-sensitive coating sensitive to the EUV illumination light 3. Afterward, at least one section of the reticle 13 is projected onto the wafer 19 with the aid of the projection exposure apparatus 1. Finally, the light-sensitive layer exposed with the EUV illumination light 3 on the wafer 19 is developed. The micro- or nano-structured component, for example, a semiconductor chip, is produced in this way. A predefined polarization setting of the illumination and/or imaging light 3 is predefined during the projection.

The invention claimed is:

1. A system, comprising:
   a facet mirror device comprising a plurality of subsystems,
   wherein, for at least some of the subsystems, each subsystem comprises:
      a mirror comprising a reflective surface configured to reflect EUV radiation; and
      a device configured to magnetize the reflective surface so that, during use of the system, the device magnetizes the reflective surface so that the reflective surface provides a magnetic field that at least partially influences at least one polarization property of light upon reflection of the light by the reflective surface.

2. The system of claim 1, wherein, for at least some of the subsystems, the reflective surface comprises a layer comprising a ferromagnetic material.

3. The system of claim 1, wherein, for at least some of the subsystems, the reflective surface comprises a layer comprising a paramagnetic material.

4. The system of claim 1, wherein, for at least some of the subsystems, the reflective surface comprises a layer comprising a magneto-electric material.

5. The system of claim 1, wherein, for at least some of the subsystems, the device comprises a magnetic field generator comprising a field coil.

6. The system of claim 1, wherein, for at least some of the subsystems, the device comprises an electric field generator.

7. The system of claim 1, wherein, for at least some of the subsystems, the device is switchable between:
   a first state configured to provide a first magnetization state of the reflective surface; and
   a second state configured to provide a second magnetization state of the reflective surface, the second magnetization state being different from the first magnetization state.

8. An optical unit, comprising:
   a mirror system according to claim 1,
   wherein the optical unit is an EUV lithography illumination optical unit configured to illuminate an illumination field.

9. A method of using an EUV microlithography projection exposure apparatus which comprises an illumination optical unit and an imaging optical unit, the method comprising:
   using the illumination optical unit to illuminate an object in an object field; and
   using the imaging optical unit to image at least a portion of the object into an image field,
   wherein the illumination optical unit comprises a mirror system according to claim 1.

10. The method of claim 9, wherein the object comprises a reticle, and a light-sensitive material is in the image field.

11. The method of claim 9, further comprising using the device to magnetize the reflective surface to at least partially influence at least one polarization property of light upon reflection of the light by the reflective surface.

12. An apparatus, comprising:
   an illumination optical unit configured to illuminate an object field; and
   an imaging optical unit configured to image the object field into an image field,
   wherein:
      the illumination optical unit comprises a mirror system;
      the mirror system comprises a facet mirror device comprising a plurality of subsystems;
      for at least some of the subsystems, each subsystem comprises:
         a mirror comprising a reflective surface configured to reflect EUV radiation; and
         a device configured to magnetize the reflective surface so that, during use of the system, the device magnetizes the reflective surface so that the reflective surface provides a magnetic field that at least partially influences at least one polarization property of light upon reflection of the light by the reflective surface; and
      the apparatus is an EUV microlithography projection exposure apparatus.

13. A system, comprising:
   a facet mirror device, comprising:
      a plurality of mirrors, each mirror comprising a reflective surface configured to reflect EUV radiation; and
      a plurality of devices,
   wherein each mirror has a corresponding device configured to magnetize the reflective surface of the mirror so that, during use of the system, the device magnetizes the reflective surface so that the reflective surface provides a magnetic field that at least partially influences at least one polarization property of light upon reflection of the light by the reflective surface.

* * * * *